United States Patent
Lee et al.

(10) Patent No.: US 10,192,646 B2
(45) Date of Patent: Jan. 29, 2019

(54) RADIATION SHIELDING SYSTEM

(71) Applicant: General Electric Company, Schenectady, NY (US)

(72) Inventors: Susanne Madeline Lee, Cocoa, FL (US); Douglas Albagli, Clifton Park, NY (US); James Michael Gent, Whitefish Bay, WI (US); Kevin Edward Kinsey, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/495,142

(22) Filed: Apr. 24, 2017

(65) Prior Publication Data

US 2017/0309355 A1    Oct. 26, 2017

Related U.S. Application Data

(60) Provisional application No. 62/326,989, filed on Apr. 25, 2016.

(51) Int. Cl.
| | |
|---|---|
| *G01T 1/20* | (2006.01) |
| *G21F 1/08* | (2006.01) |
| *G01T 1/24* | (2006.01) |
| *G21F 1/12* | (2006.01) |
| *G21F 3/00* | (2006.01) |
| *H01L 27/146* | (2006.01) |

(52) U.S. Cl.
CPC .......... *G21F 1/085* (2013.01); *G01T 1/2018* (2013.01); *G01T 1/24* (2013.01); *G21F 1/125* (2013.01); *G21F 3/00* (2013.01); *H01L 27/14623* (2013.01); *H01L 27/14658* (2013.01); *H01L 27/14676* (2013.01)

(58) Field of Classification Search
CPC .................................................... G01T 1/2018
See application file for complete search history.

(56) References Cited

U.S. PATENT DOCUMENTS

| | | | |
|---|---|---|---|
| 5,171,996 A * | 12/1992 | Perez-Mendez | G01T 1/2006 216/20 |
| 5,463,224 A | 10/1995 | Burstein et al. | |
| 5,500,534 A | 3/1996 | Robinson et al. | |
| 5,566,052 A | 10/1996 | Hughes | |
| 5,572,120 A | 11/1996 | Takaishi et al. | |
| 6,144,031 A | 11/2000 | Herring et al. | |

(Continued)

OTHER PUBLICATIONS

International Search Report and Written Opinion issued in connection with corresponding PCT Application No. PCT/US2017/029490 dated Jul. 18, 2017.

*Primary Examiner* — David Porta
*Assistant Examiner* — Djura Malevic
(74) *Attorney, Agent, or Firm* — Mintz Levin Cohn Ferris Glovsky and Popeo, P.C.

(57) ABSTRACT

A radiation shielding system for an x-ray digital detector array includes a first radiation shield having a plurality of shielding pads and a plurality of interstices between the plurality of shielding pads, the plurality of shielding pads having a greater thickness than the thickness of the plurality of interstices. The plurality of shielding pads is configured to be positioned over active components of the x-ray digital detector array and the interstices are configured to be positioned over passive components of the x-ray digital detector array.

18 Claims, 2 Drawing Sheets

(56) References Cited

U.S. PATENT DOCUMENTS

| | | | |
|---|---|---|---|
| 6,483,719 B1 | 11/2002 | Bachman | |
| 6,510,195 B1 | 1/2003 | Chappo et al. | |
| 6,658,082 B2 | 12/2003 | Okumura et al. | |
| 2004/0065839 A1* | 4/2004 | Elgali | G01T 1/1648 250/370.11 |
| 2005/0236573 A1* | 10/2005 | Vogtmeier | G01T 1/2018 250/370.09 |
| 2006/0165214 A1* | 7/2006 | Mattson | G01N 23/046 378/19 |
| 2008/0245968 A1* | 10/2008 | Tredwell | G01T 1/2018 250/370.09 |
| 2009/0121146 A1 | 5/2009 | Luhta et al. | |
| 2013/0048867 A1 | 2/2013 | Cok | |
| 2013/0101081 A1 | 4/2013 | Yaoi et al. | |
| 2013/0327947 A1* | 12/2013 | Ronda | G01T 1/1644 250/362 |
| 2014/0027828 A1* | 1/2014 | Kim | H01L 31/118 257/292 |
| 2014/0326892 A1* | 11/2014 | Ootorii | H01L 27/14663 250/366 |
| 2015/0324973 A1* | 11/2015 | Ueki | A61B 6/504 382/132 |
| 2016/0322411 A1* | 11/2016 | Elen | H01L 27/14623 |
| 2016/0322418 A1* | 11/2016 | Leblans | G01T 1/2018 |
| 2018/0003830 A1* | 1/2018 | Igarashi | G01T 1/20 |

* cited by examiner

RADIATION SHIELDING SYSTEM

CROSS-REFERENCE TO RELATED APPLICATIONS

This application claims the benefit of and priority to U.S. Provisional Patent Application Ser. No. 62/326,989, filed Apr. 25, 2016 and entitled "RADIATION SHIELDING," the entirety of which is incorporated herein by reference.

BACKGROUND

The subject matter disclosed herein relates to radiation shielding and, more particularly, to a radiation shielding system for an x-ray detector (e.g., a digital detector array (DDA)).

X-ray detectors, such as digital detector arrays (DDAs), can be used in a variety of applications, including medical and industrial applications. Some components of x-ray detectors, such as the scintillator, photodiodes, and control and readout electronics, can be susceptible to radiation damage and, without radiation protection, are typically the first DDA components to fail, especially at the radiation power levels used for industrial inspection applications. When the critical components experience x-ray or gamma-ray radiation damage, the x-ray imager can become unusable. The radiation includes both internal, e.g., fluorescence, and external, e.g., direct beam, sources of radiation. External sources of radiation can be the most intense and energetic.

X-ray detectors can include radiation shielding designed to protect the electrical components of the x-ray detectors from the external radiation experienced by the x-ray imager. As illustrated in FIG. 1, in an x-ray DDA 100, the radiation shield 106 can be placed between the motherboard 102 and the imager panel 110. The radiation shield 106 can be in the form of a sheet of material with sufficient thickness to reduce the intensity of the external radiation supported by a panel support 104. This conventional radiation shield 106 is may be a flat, uniformly thick sheet of a high x-ray absorption coefficient material such as lead, tungsten, or modern pewter. This material is positioned between the section of the x-ray detector that converts x-rays to electrical signals and the control/readout electronics of the x-ray detector.

In medical applications for instance, with radiation energies below 120 keV, this conventional radiation shielding can be sufficient to protect against external and internal sources of radiation. However, with the higher radiation energies above 160 keV that can be used in industrial applications, this radiation shielding system can be insufficient. In industrial applications, when the higher energy radiation interacts with the typical shielding material, very intense low energy, e.g., about 60-80 keV, radiation can be produced via a photoelectric effect or fluorescence.

Fluorescence emits directionally 360° and can be produced by the very material intended to protect against radiation damage, such as lead. The most intense fluorescence energies may be produced at 75 keV and several times weaker energies may be produced at 85 keV energy.

In addition, some of the high energy external radiation, once it has entered the DDA, can be scattered by materials inside the DDA, especially by light-element materials such as circuit boards. In some instances, the scattering angles can be so large as to reverse the direction of a photon, generating backscattered radiation that can impinge on other critical internal components, such as the scintillator and light imager or photodiode array. Backscattered photon intensity depends on the physics of the backscatter mechanism. At industrial inspection energies, Compton scattering dominates and light elements, such as carbon and aluminum, Compton can scatter efficiently, with the highest substantial scattering intensities backscatter direction being 180° with respect to the incident beam direction. If this radiation is sufficiently intense and prolonged, significant radiation damage can occur to the light imager and scintillator, shortening the lifetime of the DDA.

In some industrial applications, the thickness of the radiation shield that may be necessary to protect against the direct beam from the radiation source is so large that the DDA becomes prohibitively heavy. Because of safety concerns, industrial design requires that a DDA weigh near or below 100 pounds.

SUMMARY

A radiation shielding system for an x-ray digital detector array (DDA) includes a first radiation shield having a plurality of shielding pads and a plurality of interstices between the plurality of shielding pads, the plurality of shielding pads having a greater thickness than the thickness of the plurality of interstices. The plurality of shielding pads is configured to be positioned over active components of the digital detector array and the interstices are configured to be positioned over passive components of the digital detector array.

An advantage that may be realized in the practice of some disclosed embodiments of the radiation shielding system is increasing the lifetime of an x-ray DDA and the image quality produced by the DDA while decreasing the weight of a properly shielded DDA.

In an embodiment, a radiation shielding system for an x-ray digital detector having active components and passive components is described. The radiation shielding system includes a first radiation shield. The first radiation shield includes a plurality of shielding pads configured to be positioned over active components of the digital detector array. The first radiation shield also includes a plurality of interstices between the shielding pads and configured to be positioned over passive components of the x-ray digital detector array.

In another embodiment, an x-ray digital detector array is described. The x-ray digital detector includes an electronic board having active components and passive components. The x-ray digital detector also includes a light imager and a radiation shielding system positioned between the electronic board and the light imager. The radiation shielding system includes a first radiation shield having a plurality of shielding pads and a plurality of interstices positioned between the plurality of shielding pads. The plurality of shielding pads have a greater thickness than the plurality of interstices. A second radiation shield is adjacent to the first radiation shield.

The above embodiments are exemplary only. Other embodiments are within the scope of the disclosed subject matter.

BRIEF DESCRIPTION OF THE DRAWINGS

So that the manner in which the features of the invention can be understood, a detailed description of the invention may be had by reference to certain embodiments, some of which are illustrated in the accompanying drawings. It is to be noted, however, that the drawings illustrate only certain embodiments of this invention and are therefore not to be considered limiting of its scope, for the scope of the disclosed subject matter encompasses other embodiments as well. The drawings are not necessarily to scale, emphasis generally being placed upon illustrating the features of certain embodiments of the invention. In the drawings, like numerals are used to indicate like parts throughout the various views.

DETAILED DESCRIPTION

Embodiments of the disclosed subject matter provide designs for increasing the lifetime of an x-ray digital detector array (DDA), and the image quality produced by the DDA, by directly or indirectly shielding critical detector components from x-ray or gamma-ray radiation damage with multiple materials of varying composition and thickness. The materials and thicknesses can be tailored to reduce specific radiation energy ranges that impinge on these critical components by a factor of 50 or more. This application is further directed to decreasing the weight of a properly shielded x-ray DDA used for high energy industrial inspection applications by employing non-uniform thickness shielding in front of the active electrical components of a DDA.

The overall weight of a DDA can be minimized by utilizing non-uniformly thick shielding with the greatest radiation protection, i.e., the thickest shielding, positioned over the active semiconductor components, which are the most sensitive to radiation damage, on the DDA electronic circuit boards. Thinner shielding in the regions where there are no active components on the electronic circuit boards enables protection of other critical components of the DDA, such as the scintillator and light imager 110, from radiation scattered within the interior of the DDA. The thickness of this thinner shielding is determined by the energy of the scattered radiation within the DDA. Other embodiments are within the scope of the disclosed subject matter.

Figure 1:
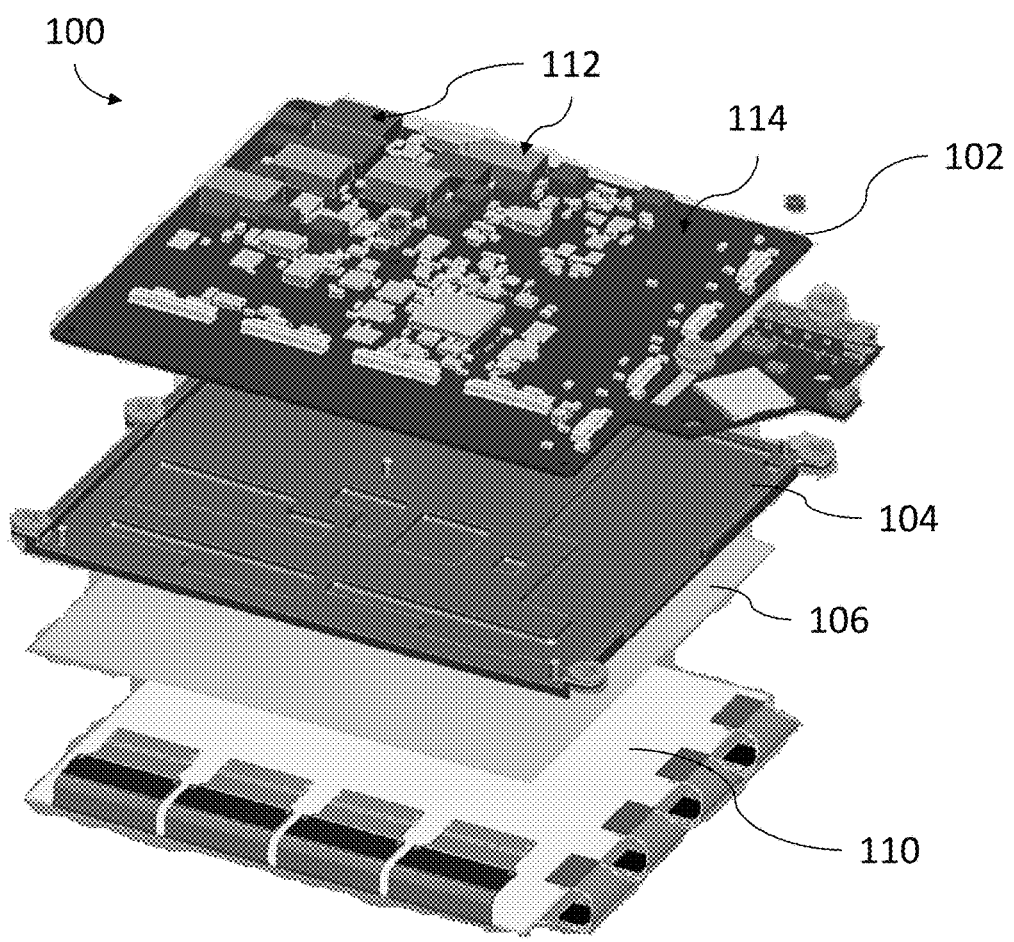
FIG. 1 is an exploded isometric view of an x-ray digital detector array (DDA) having an embodiment of a prior art radiation shielding system.
Figure 2:
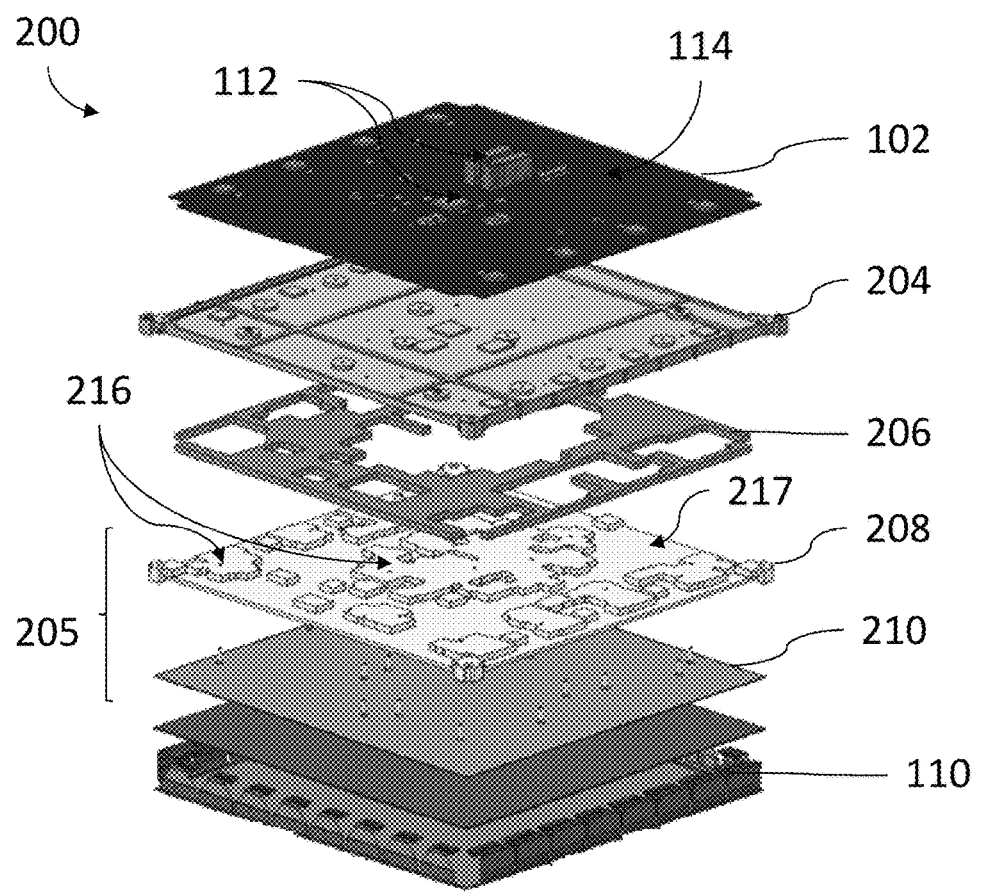
FIG. 2 is an exploded isometric view of an x-ray digital detector array (DDA) having an embodiment of a radiation shielding system.

FIG. 2 is an exploded isometric view of an x-ray digital detector array (DDA) 200 having an embodiment of a radiation shielding system 205. The radiation shielding system 205 can be positioned between an electronic circuit board 102 and the imager panel 110 of the x-ray DDA 200. In an embodiment, the radiation shielding system 205 can include a first radiation shield 208 and a second radiation shield 210. A support 204 may be positioned to secure and support the radiation shielding system 205.

As illustrated in FIG. 2, the radiation shielding system 205 of the DDA 200 can include a first radiation shield 208 having one or more, or a plurality of shielding pads 216 positioned to correspond to the locations of at least one of the active components 112 of the electronic circuit board 102. A one or more, or a plurality of interstices 217 can extend between the shielding pads 216 and can be positioned to correspond to the locations of the passive components 114 of the electronic circuit board 102. In some DDA electronic circuit boards, the passive components 114 can constitute the majority of the board, with the active components 112 interspersed among the passive components 114. In this embodiment, the radiation shield 208 includes a plurality of shielding pads 216 suspended in a matrix (the interstices 217) in front of the mother board 102 at locations corresponding to the locations of at least one of the active components 112 of the motherboard 102. The material of the pads 216 can be selected based on the x-ray energies to be protected against. In particular, the shielding pads 216 can be formed of a material with a high x-ray absorption coefficient, such as lead, tungsten, tin, or modern pewter. In an example, a 1 mm thick layer of modern pewter can absorb various amounts of fluorescence energies. For example, 1 mm thick modern pewter can absorb 94% of 75 keV x-rays and absorbs 85% of 85 keV x-rays. In another example, the pads can be made of tungsten with a thickness of 11 mm to protect the active semiconductor components on a standard phenolic-compound electronics board 112 inside a DDA (200) from a 450 keV Bremsstrahlung x-ray source.

In an embodiment, the plurality of pads can be embedded in a matrix, such as an epoxy matrix. In some embodiments, the epoxy can introduce the side-effect, at industrial inspection imaging energies, of efficiently back-scattering x-rays that have passed through the light imager 110 into the interior of the DDA, which may be undesirable. These back-scattered x-rays can damage the materials from which the pixels in the light imager 110 are made. Additionally, these backscattered x-rays can continue into the scintillator (not illustrated), where the backscattered x-rays can be converted into visible light that is detected by the light imager 110. This secondary light can fog the original image, resulting in diminished DDA signal to noise ratio, sensitivity, and resolution. In another example, the matrix is a material that minimizes scattered radiation interior to the DDA 200. For example, the matrix material can be an epoxy material filled with small particulates of metals such as lead, tin, tungsten, and pewter.

In another embodiment, the radiation shield 208 can be made of a material or materials having varying thicknesses. For example, as illustrated in FIG. 2, the first radiation shield 208 can have a plurality of radiation shield pads 216 positioned to align with the positions of the active components 112 of the electronic circuit board 102 and a plurality of interstices 217 between the pads 216. The pads 216 can have a greater thickness than the interstices 217. For example, the pads 216 can have a thickness of about 5-12 mm and the interstices 217 can have a thickness of about 1-4 mm. For example, the pads can have a thickness of 11 mm and the interstices 217 can have a thickness of 4 mm. In other embodiments, the pads 216 can have a thickness of greater than 12 mm and/or the interstices 217 can have a thickness of greater than 4 mm. In another embodiment, the interstices 217 can have a thickness less than 1 mm. Due to the decreased thickness of the interstices 217, the overall weight of the DDA can be decreased while maintaining the overall radiation protection of the DDA. In an example, the interstices 217 and the pads 216 are formed of the same material, such as lead, tungsten, or pewter. In another example, the interstices 217 and the pads 216 are formed of different materials. For example, the interstices 217 can be formed of lead and the pads 216 can be formed of tungsten. In some embodiments where the interstices 217 and pads 216 are formed of different materials the transmission of a specific type of external or internal radiation may be minimized.

The radiation shield 208 having varying thicknesses can be formed by any suitable method. For example, the radiation shield 208 can be machined from a sheet of material having the maximum thickness. In another example, the radiation shield 208 can be formed by an additive manufacturing method or 3D printed.

As illustrated in FIG. 2, due to the decreased thickness of the radiation shield 208, a shield support 206 can be positioned to support and maintain the shape of the radiation shield 208. In an example, if the radiation shield 208 is oriented with the pads 216 on the far side of the radiation shield 208 from the light imager 110, the radiation shield support 206 can have a non-uniform thickness and look like the negative of the non-uniform thickness shield 208. In this embodiment, the thicker regions of the shield support 206 fit against the interstices 217 between the pads 216 of the radiation shield 208. In one example, the shield support 206 can be made from a fiber, such as, for example, carbon, silicon, or, silicon-carbide-enhanced prepreg, which can provide sufficient support for assembly and/or long term structural integrity of the radiation shield 208. A fiber shield support 206 can enable manufacturability of the digital detector array 200 including the radiation shielding system 205. In another example, aluminum and/or plastic can be used to stiffen the non-uniform thickness radiation shield 208.

In the embodiment illustrated in FIG. 2, the radiation shielding system 205 further includes a second radiation shield 210. In this embodiment, the second shield 210 can be flat with a uniform thickness. The thickness of the first shield 208 can be different from the thickness of the second shield 210. Additionally, the material thickness of each shield 208, 210 can be determined by a number of engineering considerations, such as desired detector lifetime and overall detector weight. In an example, 15 mm of tungsten can transmit less than 0.1% of 450 keV photons. However, tungsten is dense and, in a 16"×16" DDA, would result in the DDA weighing over 200 pounds. A DDA weighing over 200 pounds may not be preferred in certain implementations, for example, certain medical settings where such a heavy weight increases the likelihood of injury should the mechanism supporting the DDA fail or the DDA fall on someone. Thus, depending on application, industry, and/or preferences, there may be a tradeoff between minimizing damage to the DDA, i.e., long DDA lifetime, and DDA weight.

In this embodiment, the second radiation shield 210 can be formed of a second shielding material that is different from the first material(s) of the first radiation shield 208. By employing multiple materials between multiple radiation shields, each material designed to minimize or lower transmission of a specific type of external or internal radiation, damage from both external and internal radiation can be minimized. The material composition can be chosen from those with the highest absorption coefficient for each radiation energy range of interest. For example, the first and second materials can each be selected from the group of heavy metals, including lead, pewter, tungsten, and tin. In another embodiment, the first and/or second material is a combination of heavy metals. In an example, the first material of the first shield 208 can be different from the second material of the second shield 210.

In addition, an unavoidable consequence of using high-atomic number materials such as lead and tungsten is that when they are impacted by an external beam, the materials can fluoresce. Therefore, to protect the scintillator and light imager 110 from this fluorescence, another, lighter atomic number material can be employed. The optimal material composition can be determined by matching the absorption of the lighter atomic number material with the fluorescent energy of the heavier atomic number materials. For example, if lead and tungsten are selected, tin can be selected to protect against fluorescence of the lead and tungsten. At least one possible benefit of this lower atomic number material eliminating or significantly reducing the fluorescence from the heavier atomic number shields is an improvement in image quality, as the fluorescence has no image information and only serves to raise the noise level in the image produced by the digital detector array. In an embodiment, the first shield 208 is formed of lead with the plurality of pads 216 having a thickness of about 11 mm and the plurality of interstices 217 having a thickness of about 4 mm and the second shield 210 is formed of pewter and has a uniform thickness of 1 mm.

In an example (not illustrated), the radiation shielding system 205 includes three sheets of three materials, tin (Sn), tungsten (W), and lead (Pb), to protect against a 450 keV Bremsstrahlung x-ray spectrum, with the thicknesses of each of the three sheets dependent on the energy of the Bremsstrahlung spectrum.

Possible advantages of the above described system include providing shielding against external and internal radiation in a digital detector array. Another advantage may be minimizing the overall weight of the array.

To the extent that the claims recite the phrase "at least one of" in reference to a plurality of elements, this is intended to mean at least one or more of the listed elements, and is not limited to at least one of each element. For example, "at least one of an element A, element B, and element C," is intended to indicate element A alone, or element B alone, or element C alone, or any combination thereof. "At least one of element A, element B, and element C" is not intended to be limited to at least one of an element A, at least one of an element B, and at least one of an element C.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A radiation shielding system for an x-ray detector array comprising active components and passive components, the radiation shielding system comprising:
   a first radiation shield comprising a plurality of shielding pads configured to be positioned over active components of the digital detector array and a plurality of interstices between the shielding pads and configured to be positioned over passive components of the x-ray detector array,
   wherein the plurality of shielding pads have a greater thickness than a thickness of the plurality of interstices.

2. The radiation shielding system of claim 1, wherein each of the plurality of interstices has a thickness of about 1 mm to about 4 mm.

3. The radiation shielding system of claim 1, wherein each of the plurality of shielding pads has a thickness of about 5 mm to about 12 mm.

4. The radiation shielding system of claim 1, wherein the plurality of shielding pads are formed of a first material selected from lead, tungsten, pewter, tin, or a combination thereof.

5. The radiation shielding system of claim 4, wherein the plurality of interstices are formed of the first material.

6. The radiation shielding system of claim 4, wherein the plurality of interstices are formed of a second material different from the first material, the second material selected from lead, tungsten, pewter, tin, or a combination thereof.

7. The radiation shielding system of claim 4, wherein the plurality of interstices comprise a matrix material in which the plurality of shielding pads is suspended.

8. The radiation shielding system of claim 1, further comprising a shield support configured to support and maintain a shape of the first radiation shield.

9. The radiation shielding system of claim 1, further comprising a second radiation shield adjacent to the first radiation shield.

10. The radiation shielding system of claim 9, wherein the second radiation shield comprises a uniform thickness.

11. The radiation shielding system of claim 9, wherein the first radiation shield is formed of a first material and the second radiation shield is formed of a third material, and wherein the third material is different from the first material.

12. The radiation shielding system of claim 11, wherein the first material and third material are each selected from lead, pewter, tungsten, tin, or a combination thereof.

13. An x-ray detector array, comprising:
   an electronic board comprising active components and passive components;
   a light imager; and
   a radiation shielding system positioned between the electronic board and the light imager, the radiation shielding system comprising:
      a first radiation shield having a plurality of shielding pads and a plurality of interstices positioned between the plurality of shielding pads, the plurality of shielding pads having greater thickness that the plurality of interstices; and
      a second radiation shield adjacent to the first radiation shield.

14. The x-ray detector array of claim 13, wherein the first radiation shield is formed of a first material and the second radiation shield is formed of a second material, and wherein the first material is different from the second material.

15. The x-ray detector array of claim 14, wherein the second material has a lower atomic number than the first material.

16. The x-ray detector array of claim 13, further comprising a shield support configured to support the first radiation shield.

17. The x-ray detector array of claim 13, wherein the second radiation shield has a uniform thickness.

18. The x-ray detector array of claim 13, wherein the plurality of shielding pads are positioned to correspond to locations of the active components of the electronic board and the plurality of interstices are positioned to correspond to locations of the passive components of the electronic board.

* * * * *